United States Patent
Mittelholzer et al.

(10) Patent No.: US 9,059,744 B2
(45) Date of Patent: *Jun. 16, 2015

(54) ENCODING A DATA WORD FOR WRITING THE ENCODED DATA WORD IN A MULTI-LEVEL SOLID STATE MEMORY

(75) Inventors: Thomas Mittelholzer, Zurich (CH); Nikolaos Papandreou, Zurich (CH); Charalampos Pozidis, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 441 days.

This patent is subject to a terminal disclaimer.

(21) Appl. No.: 13/596,351

(22) Filed: Aug. 28, 2012

(65) Prior Publication Data
US 2012/0324313 A1    Dec. 20, 2012

Related U.S. Application Data

(63) Continuation of application No. 13/418,423, filed on Mar. 13, 2012, now Pat. No. 8,839,076.

(51) Int. Cl.
| G11C 29/00 | (2006.01) |
|---|---|
| H03M 13/25 | (2006.01) |
| H03M 13/29 | (2006.01) |
| H03M 13/31 | (2006.01) |
| H03M 13/35 | (2006.01) |
| G11C 11/56 | (2006.01) |
| G06F 11/10 | (2006.01) |

(Continued)

(52) U.S. Cl.
CPC ......... H03M 13/251 (2013.01); *G06F 11/1072* (2013.01); *G11C 29/00* (2013.01); *G11C 2211/5641* (2013.01); *H03M 13/1515* (2013.01); *H03M 13/19* (2013.01); *H03M 13/253* (2013.01); *H03M 13/2906* (2013.01); *H03M 13/31* (2013.01); *H03M 13/353* (2013.01); *G11C 11/5678* (2013.01); *G11C 29/70* (2013.01)

(58) Field of Classification Search
CPC . H03M 13/251; H03M 13/15; G06F 11/1072; G11C 2211/5641; G11C 2211/562; G11C 2211/563
USPC ......... 714/773, 755, 752, 777, 778, 800, 801, 714/803, 799
See application file for complete search history.

(56) References Cited

U.S. PATENT DOCUMENTS

| 7,778,079 B2 | 8/2010 | Jeong et al. |
|---|---|---|
| 8,055,979 B2 * | 11/2011 | Wu et al. ...................... 714/773 |

(Continued)

OTHER PUBLICATIONS

Doe Hyun Voon; Muralimanohar. N.: Jichuan Chang; Ranganathan. P.; Jouppi, N.P.; Erez, M.;, "FREE-p: Protecting non-volatile memory against both hard and soft errors," High Performance Computer Architecture (HPCA), 2011 IEEE 17th International Symposium on , vol., No., pp. 466-477, Feb. 12-16, 2011.

(Continued)

*Primary Examiner* — Christine Tu
(74) *Attorney, Agent, or Firm* — Jeff Tang (57) ABSTRACT

A method for encoding a data word for writing an encoded data word in N cells of a solid state memory. Each of the N cells can be programmed in one of q nominal levels. The method includes encoding the data word as a codeword of a first codeword type having q symbol values or as a codeword of a second codeword type having (q−d) symbol values, d∈[1, . . . , q−1], depending on a state of the N cells.

2 Claims, 9 Drawing Sheets

(51) Int. Cl.
  *H03M 13/15* (2006.01)
  *H03M 13/19* (2006.01)

(56) References Cited

U.S. PATENT DOCUMENTS

| | | | |
|---|---|---|---|
| 8,656,258 B2* | 2/2014 | Kim et al. | 714/774 |
| 8,656,263 B2* | 2/2014 | Hu et al. | 714/792 |
| 2008/0212352 A1 | 9/2008 | Oh et al. | |
| 2008/0244370 A1 | 10/2008 | Lam | |
| 2009/0013223 A1 | 1/2009 | Lam | |
| 2009/0024905 A1 | 1/2009 | Shalvi et al. | |
| 2009/0319864 A1 | 12/2009 | Shrader | |
| 2010/0115376 A1 | 5/2010 | Shalvi et al. | |
| 2010/0218073 A1 | 8/2010 | Kang et al. | |
| 2010/0269017 A1 | 10/2010 | Bueb | |
| 2011/0296274 A1 | 12/2011 | Mittelholzer et al. | |

OTHER PUBLICATIONS

Nak Hee Seong: Dong Hyuk Woo: Srinivasan, V.; Rivers, J.A.; Lee. H.-H.S.;, "SAFER: Stuck-At-Fault Error Recovery for Memories," Microarchitecture (MICRO), 2010 43rd Annual IEEE/ACM International Symposium on , vol., No., pp. 115-124, Dec. 4-8, 2010.

Ipek et al., "Dynamically Replicated Memory; Building Reliable Systems from Nanoscale Resistive Memories", International Conference on Architectural Support for Programming Languages and Operating Systems, Pittssburgh, PA. vol. 45, No. 3, pp. 3-14 [12 page(s) (article)] Mar. 2010.

* cited by examiner

ENCODING A DATA WORD FOR WRITING THE ENCODED DATA WORD IN A MULTI-LEVEL SOLID STATE MEMORY

CROSS-REFERENCE TO RELATED APPLICATION

This application is a continuation of and claims priority from U.S. application Ser. No. 13/418,423 filed on Mar. 13, 2012, which in turn claims priority under 35 U.S.C. §119 from European Patent Application No. 11160585.3 filed Mar. 31, 2011, the entire contents of both applications are incorporated herein by reference.

BACKGROUND OF THE INVENTION

1. Field of the Invention

The invention relates to a method and to an encoder for encoding a data word for writing the encoded data word in N cells of a solid state memory. Further, the invention relates to a method and to a decoder for decoding a codeword written in N cells of a solid state memory.

2. Description of Related Art

A solid state memory uses electronic circuitry, such as integrated circuits, for storing data or data words rather than conventional magnetic or optical media like disks and tapes. Solid state storage devices such as flash memory devices are currently revolutionizing the data storage landscape. These devices are more rugged than conventional storage devices due to the absence of moving parts, and offer exceptional bandwidth, significant savings in power consumption, and random I/O (input/output) performance that is orders of magnitude better than hard disk drives (HDDs).

In some types of solid state memory, the fundamental storage unit, called the cell, can be set to only two levels for recording only binary values. Other types of solid state memory have so-called multi-level cells which can be set to q different levels, where q>2. For example, flash memory and phase change memory (PCM), two important non-volatile memory technologies, permit such multi-level recording. For instance, NOR flash memories can store four levels, i.e. two bits, per cell. Multi-level cell (MLC) NAND flash memory chips that can store four bits of data per single flash cell using 43 nm process technology are available.

PCM is a non-volatile solid state memory technology that exploits a reversible, thermally-assisted switching of certain chalcogenide and non-chalcogenide compounds between certain states of different electrical conductivity.

PCM is a promising and advanced emerging non-volatile memory technology mainly due to its excellent features including low latency, high endurance, long retention and high scalability. PCM can be considered a prime candidate for flash replacement, embedded/hybrid memory and storage-class memory. Key requirements for competitiveness of PCM technology are multi-level cell functionality, in particular for low cost per bit; further requirements are high-speed read/write operations, in particular for high bandwidth. Multilevel functionality, i.e., multiple bits per PCM cell, is a way to increase capacity and thereby to reduce cost.

Multi-level PCM is based on storing multiple resistance levels between a lowest (SET) and a highest (RESET) resistance value. Multiple resistance levels or simply levels correspond to partial-amorphous and partial-crystalline phase distributions of the phase-change material of the PCM cell. Phase transformation, i.e., memory programming, can be enabled by Joule heating. In this regard, Joule heating can be controlled by a programming current or voltage pulse. Storing multiple resistance levels in a PCM cell is a challenging task. Issues like process variability, as well as intra-cell and inter-cell material parameter variations can give rise to deviations of the achieved resistance levels from their intended values.

For instance, in single-step programming approaches, single write pulses are applied in order to amorphize or crystallize a certain fraction of the phase change material of the PCM cell. The amplitude of the programming pulse is determined by the characteristic R-I programming curve of the PCM cell. Although, the programming curves of various cells exhibit similar overall behavior, there are variations of the PCM cells that can cause variations of the programmed levels in multi-level storage.

In particular, the cells in a large PCM array can show some variability of the electrical behavior. The same write signal can not result in exactly the same state of each cell generally. As a result, when probing the cell to read-out its state, there can be a cell-to-cell variability of the read-back signal, that is the inferred resistance level or any other metric, which is indicative of the cell's state, can vary from cell to cell.

Conventionally, this variability can be compensated by an adaptive iterative write scheme. A cell can be considered to be correctly written if the read-back signal lies within a pre-defined range around the written nominal level. However, a few cells can be partially-defective and allow only a limited range of resistance values to be written correctly. Because these partially-defective cells can not support writing all the nominal levels within the full resistance range of the PCM array, multilevel coding can be not possible. The range limitation in partially-defective cells can, for example, affect the high resistance values close to the reset state, or it can affect the low resistance values close to the set state, depending on the cell characteristics. A coding method proposed in L. A. Lastras, et al., "Algorithms for memories with stuck cells," Proc. IEEE SIT 2010, Austin, June 2010, pp. 968-972 is based on linear BCH-like codes.

SUMMARY OF THE INVENTION

According to an embodiment of the invention, a method for encoding a data word for writing or recording an encoded data word in N cells of a solid state memory is suggested. Each of the N cells can be programmed to one of q nominal levels. The method includes a step of encoding the data word as a codeword of a first codeword type having q symbol values or as a codeword of a second codeword type having (q−d) symbol values, d∈[1, . . . , q−1], depending on a state of the N cells.

According to a second embodiment, a method for writing a data word as an encoded data word in N cells of a solid state memory by a writing scheme using a list of partially-defective cells is suggested. Each of the N cells has q programmable levels. If none of the N cells is listed in the list of partially-defective cells, the data word is encoded as a codeword of a first codeword type having q symbol values and a first write signal is supplied to the N cells for writing the codeword of the first codeword type. If at least one of the N cells is listed in the list of partially-defective cells, the data word is encoded as a codeword of a second codeword type having (q−d) symbol values, d∈[1, . . . , q−1], and a second write signal is supplied to the N cells for writing the codeword of the second codeword type.

According to a third embodiment, A method for writing a data word as an encoded data word in N cells of a solid state memory by a writing scheme using a list of partially-defective cells, each of the N cells having q programmable levels is presented. If none of the N cells is listed in the list of partially-defective cells, encoding the data word as a codeword of a first codeword type having q symbol values and supplying a first write signal to the N cells for writing the codeword of the first codeword type, and if at least one of the N cells is listed in the list of partially-defective cells, encoding the data word as a codeword of a second codeword type having (q−d) symbol values, d∈[1, . . . , q−1], and supplying a second write signal to the N cells for writing the codeword of the second codeword type.

According to a fourth embodiment, an encoder is presented. An encoder for encoding a data word for writing an encoded data word in N cells of a solid state memory, each of the N cells having q programmable levels, where the encoder is configured to encode the data word as a codeword of a first codeword type having q symbol values or as a codeword of a second codeword type having (q−d) symbol values, d∈[1, . . . , q−1], in dependence on a state of the N cells.

According to a fifth embodiment, a decoder for decoding a codeword written in N cells of a solid state memory, each of the N cells having q programmable levels is presented. The decoder includes a receiver which is configured to receive a read back signal from the N cells for reading back the written codeword and a processor which is configured to determine if the written codeword is of the second codeword type in dependence on the received read back signal and which is configured to provide side information to an error correcting code in dependence on a determined written codeword of the second codeword type.

In the following, exemplary embodiments of the present invention are described with reference to the enclosed figures.

BRIEF DESCRIPTION OF THE DRAWINGS

Similar or functionally similar elements in the figures have been allocated the same reference signs if not otherwise indicated.

DETAILED DESCRIPTION OF THE PREFERRED EMBODIMENTS

An encoding scheme is proposed that has two different modes: in the first mode, codewords of the first codeword type (so-called standard codewords) are produced and, in the second mode, codewords of the second codeword type (so-called excess codewords) are produced. In particular, an excess codeword can be used in the case that a partially-defective cell needs to be written. For excess codewords, only a limited range of levels of the cell can be used.

For excess codewords, a smaller number of symbol values and, therefore, a smaller number of levels in the cell can be used. The symbol values of excess codewords can be selected such that critical levels in the cells which are difficult to write can be avoided. As mentioned above, high-resistant levels close to the reset state can be more difficult to write, whereas other resistance levels can be written with higher reliability.

The standard codewords can be used to operate under nominal conditions. The excess codewords can be used in a case that partially-defective cells need to be written. According to an embodiment of the invention the decision whether a length-N standard codeword or an excess codeword is written depends on the N cells to be written. If all N cells are non-defective, i.e., all q levels can be written correctly, a standard length-N codeword is used. In case of a partially-defective cell, i.e., only (q−d) levels can be written correctly, an excess codeword is used.

It is attempted to write a standard codeword. If this fails, e.g., if in one of the N cells a nominal resistance level cannot be written correctly, a corresponding excess codeword is selected and written instead. As a result, for the case that the solid state memory contains at least one partially-defective cell, the storage capacity of the solid state memory is increased by using the present encoding scheme compared to conventional encoding schemes. The increase of capacity is reached because by using the present encoding scheme also partially-defective cells can be used.

As indicated above, the solid state memory can be configured for multi-level recording. Thus, each cell of the solid state memory can be programmed to one of q levels (q>1), in particular resistance levels. The different levels of the cell correspond to different values of a quantity, which is representative of the cells state. As a result of having different levels, the cell has a number of discrete states.

The q levels of a cell need not be equally-spaced on a linear scale in terms of the physical quantity, e.g., electrical resistance, which defines the level thresholds. That is, the q levels can correspond to respective, unequally-spaced values of the physical quantity. For example, the set of levels can be represented by electrical resistance values on a logarithmic scale. Also, levels in the middle of the range can tend to be subject to more noise than levels towards the ends of the range. To address this, the middle levels can be spaced apart further than other levels. Examples of multi-level solid state memories are phase change memories (PCM), NOR flash memories and NAND flash memories.

The data word can be encoded as the codeword of the first codeword type, if during the iterative write process the state of the N cells indicates that all N cells have been correctly written, and as the codeword of the second codeword type, if the state of the N cells indicates that at least one of the N cells has been incorrectly written. In other words, the data word is encoded as the codeword of the first codeword type, if the state of the N cells indicates no partially-defective cell in the N cells, and as the codeword of the second codeword type, if the state of the N cells indicates at least one partially-defective cell within the N cells. In particular, the first case and the second case are mutually exclusive.

A partially-defective cell is a cell in which not all q levels, but only (q−d) levels can be written correctly. For example, in a partially-defective cell, higher resistance levels cannot be written correctly after certain number of iterations of a write scheme.

The data word can be encoded as the codeword of the first codeword type such that the codeword has N components, wherein each of the N components is mapped to one of the N cells and has one of the q symbol values, each of the q symbol values being mapped to one of the q levels of the mapped or corresponding cell.

The data word is encoded as the codeword of the second codeword type such that the codeword has N components, wherein each of the N components is mapped to one of the N cells and has one of the (q−d) symbol values, each of the (q−d) symbol values is mapped to one of the (q−d) levels of the mapped or corresponding cell.

The data word can also be encoded as the codeword of the first codeword type, if the N components of the codeword of the first codeword type can be written correctly in the N cells. Otherwise, the data word is encoded as the codeword of the second codeword type.

The above-mentioned embodiment can be illustrated by a writing scheme having M iterations. For the (M−1) first times of the writing scheme, it is tried to write the codeword of the first codeword type in the N cells correctly. If the codeword of the first codeword type is not correctly written in the N cells after (M−1) writing attempts, the data word is encoded as the codeword of the second codeword type and the codeword of the second codeword type is written in the N cells. Other options of writing schemes can use a list of partially-defective cells, which is obtained from previous write/read operations. Given a list of partially-defective cells, one can, e.g., mark these cells as erasures and do no further writing, or use second-type codewords.

The data word can also be encoded as the codeword of the first codeword type, if each of the symbol values of the N components can be written correctly in the respective mapped level of the respective cell of the N cells. Otherwise, the data word is encoded as the codeword of the second codeword type. The encoding can be sequentially executed for a plurality of data words.

Also, each codeword of the second codeword type has a Euclidean distance to each codeword of the first codeword type which is greater or equal to a minimum Euclidean distance between the codewords of the first codeword type. Thus, each excess codeword has a high Euclidean distance to each of the standard codewords. As a result, excess codewords can be reliably detected by the decoder.

The data word can also be encoded as a codeword of the first codeword type by means of a translation-stable code or the data word is encoded as a codeword of the second codeword type by means of the translation-stable code.

In a translation-stable code, each data word in the set of all possible input data words is encoded as a codeword with a unique sequence of relative symbol values (see US 2011/0296274 A1). In particular, the N symbols of each codeword can be recorded in respective cells, each of the N cells being set to the level corresponding to the symbol value according to the predetermined correspondence between symbol values and cell levels. Since each possible input data word maps to a codeword with a unique sequence of relative symbol values, each data word can be recorded as a correspondingly unique relative level sequence. Note that it is relative, as opposed to the absolute, symbol values that are critical, i.e. the symbol values relative to some predetermined reference value or sequence, for example the lowest symbol value in a codeword, or zero, or an average or another predefined reference.

In the following, five examples of translation-stable codes are described:

1. EXAMPLE

Code Cq4N7

The Code Cq4N7 is a translation-stable code C with four symbol values (q=4) and seven components (N=7). The code has four standard initial vectors c(j), where j={1,2,3,4} (see Table 1). The set of all permutations of the initial vector c(j) is denoted by $\pi(c^{(j)})$ and $\#\pi(c^{(j)})$ denotes the cardinality of that set. Thus, there are M=2100 codewords, which corresponds to a rate of 1.5766 bit/cell. The minimum squared Euclidean distance is 2. Thus, the coding gain compared to uncoded signaling is 3 dB. The subcode given by M'=2048 codewords has a rate 11/7=1.5714 bit/cell. In contrast, an uncoded transmission has rate 2 bit/cell, but is vulnerable to drift. There is an (excess) erasure codeword c(5) for flagging partially-defective cells. The excess codeword c(5) has at least a minimum squared Euclidean distance of 19 towards the standard codewords and, therefore, it can be easily distinguished from the standard codewords.

TABLE 1

| $c^{(j)}$ initial vectors | $\# \Pi(c^{(j)})$ |
|---|---|
| c(1) = [0 1 1 2 2 3 3] | 630 |
| c(2) = [0 0 1 1 2 2 3] | 630 |
| c(3) = [0 0 0 1 2 3 3] | 420 |
| c(4) = [0 0 1 2 3 3 3] | 420 |
| c(5) = [0 0 0 0 0 0 0] | 1 |

2. EXAMPLE

Code Cq5N7

The Code Cq5N7 is a translation-stable code C with five symbol values (q=5) and seven components (N=7). The code has four standard initial vectors c(j), where j={1,2,3,4} (see Table 2). There are M=4410 possible codewords and a subcode with 4096 standard codewords, which corresponds to a rate of 12/7 bit/cell. The minimum squared Euclidean distance is 2. There is an (excess) erasure codeword c(5) for flagging partially-defective cells. The excess codeword c(5) has at least a minimum squared Euclidean distance of 19 towards the standard codewords and, therefore, it can be easily distinguished from the standard codewords.

TABLE 2

| c(j) initial vectors | $\# \Pi(c(j))$ |
|---|---|
| c(1) = [0 0 1 2 3 3 4] | 1260 |
| c(2) = [0 1 2 3 3 4 4] | 1260 |
| c(3) = [0 1 1 2 2 3 4] | 1260 |
| c(4) = [0 0 1 1 2 2 3] | 630 |
| c(5) = [0 0 0 0 0 0 0] | 1 |

3. EXAMPLE

Code Cq5N7e10

The Code Cq5N7e10 is a translation-stable code C with five symbol values (q=5), seven components (N=7) and $2^{10}$ excess codewords. The code has six standard initial vectors c(j) (see Table 3). There are M=4410 standard codewords based on the first six initial vectors c(1) to c(6) and a subcode of 4096 of these codewords has a rate of 12/7 bit/cell. The minimum squared Euclidean distance is 2.

There are 1050>$2^{10}$ excess codewords based on the last three initial vectors c(7) to c(9) (see Table 4), which use no more than q−1=4 levels. These excess codewords do not require writing of the highest level; therefore, they can be used if a cell does not support the writing of the highest level. The minimum squared Euclidean distance among the excess codewords is 2 and the minimum squared Euclidean distance between the standard and excess codewords is 4.

TABLE 3

| standard initial vectors | # Π(c(j)) |
|---|---|
| c(1) = [0 1 2 3 4 4 4] | 840 |
| c(2) = [0 0 1 2 3 4 4] | 1260 |
| c(3) = [0 1 1 3 3 4 4] | 630 |
| c(4) = [0 0 1 1 1 3 4] | 420 |
| c(5) = [0 0 0 1 2 3 4] | 840 |
| c(6) = [0 1 3 3 3 4 4] | 420 |

TABLE 4

| excess initial vectors | # Π(c(j)) |
|---|---|
| c(7) = [0 1 1 2 2 3 3] | 630 |
| c(8) = [0 1 2 2 2 2 3] | 210 |
| c(9) = [0 1 1 1 2 2 3] | 210 |

According to an embodiment, if in the writing process, there are no difficulties in writing all q=5 levels, one uses 4096 of the standard codewords (see Table 3). If the write process does not support the writing of the highest level, one uses 1024 excess codewords. In the latter case, only 10 out of the 12 user bits can be written and two bits are erased.

During read-back, the decoder can determine what initial vector and which permutation of it were written. When a standard codeword is decoded, the decoder returns a 12-bit vector. When an excess codeword is decoded, the decoder produces a 10-bit output and an erasure flag to indicate the two missing bits. The squared minimum distance among the standard codewords is the same as the squared minimum distance among the excess codewords, namely 2. The minimum distance between the standard codewords and the excess codeword is twice as large, namely 4, and, therefore, it is unlikely that an excess codeword is decoded as a standard codeword and vice versa.

4. EXAMPLE

Code Cq6N8

The Code Cq6N8 is a translation-stable code C with six symbol values (q=6) and eight components (N=8). The code is given by the union of the nine permutation modulation codes π(c(j)) with initial vectors c(j), c(1) to c(9) (see Table 5). There are 67200>$2^{16}$ codewords, which corresponds to a rate of 2 bit/cell. The code has squared minimum distance $d_{min}^2$=2 prior to and after the projection onto the hyperplane orthogonal to the all-one vector [1 1 . . . 1]. Thus, there is an asymptotic coding gain of 3 dB compared to uncoded signaling at a rate of $\log_2$ (6)=2.585. There is an erasure codeword c(10) for flagging partially-defective cells, which compared to $d_{min}^2$ has a large squared distance from the standard codewords.

TABLE 5

| c(j) initial vectors | # Π(c(j)) |
|---|---|
| c(1) = [0 0 1 1 2 3 4 5] | 10080 |
| c(2) = [0 0 1 2 3 4 5 5] | 10080 |
| c(3) = [0 1 2 2 3 3 4 5] | 10080 |
| c(4) = [0 1 2 3 4 4 5 5] | 10080 |
| c(5) = [0 1 1 2 3 4 4 5] | 10080 |
| c(6) = [0 0 1 2 2 3 4 4] | 5040 |
| c(7) = [0 1 1 2 2 3 3 4] | 5040 |
| c(8) = [0 1 1 1 2 3 4 4] | 3360 |
| c(9) = [0 0 1 2 3 3 3 4] | 3360 |
| c(10) = [0 0 0 0 0 0 0 0] | 1 |

5. EXAMPLE

Code Cq6N8e13

The Code Cq6N8e13 is a translation-stable code C with six symbol values (q=6), eight components (N=8) and $2^{13}$ excess codewords.

The code is given by the union of the ten permutation modulation codes π(c(j)) with initial vectors c(j) (see Table 6). It is an oversized code with 8×10080>$2^{16}$ standard codewords and 8400>$2^{13}$ excess codewords with restricted levels. The code has a squared minimum Euclidean distance $d_{min}^2$=2

The squared Euclidean distance between the regular and the excess codewords is at least 3>$d_{min}^2$. The first eight permutation modulation subcodes form a code with more than $2^{16}$ codewords resulting in a rate of at least 2 bit/cell. The last two permutation modulation subcodes do not use the highest level 5. In case of a partially-defective cell, which prevents one from writing level 5, the $2^{13}$ excess codewords of these last two subcodes can be used to write 13 of the 16 data bits. The decoder can detect the use of the spare codewords and it can flag the three missing data bits as erasures, which can be corrected by an outer error-correction coding scheme.

TABLE 6

| c(j) initial vectors | # Π(c(j)) |
|---|---|
| c(1) = [0 0 1 1 2 3 4 5] | 10080 |
| c(2) = [0 0 1 2 3 3 4 5] | 10080 |
| c(3) = [0 0 1 2 3 4 5 5] | 10080 |
| c(4) = [0 1 2 2 3 3 4 5] | 10080 |
| c(5) = [0 1 2 2 3 4 5 5] | 10080 |
| c(6) = [0 1 2 3 4 4 5 5] | 10080 |
| c(7) = [0 1 1 2 2 3 4 5] | 10080 |
| c(8) = [0 1 1 2 3 4 4 5] | 10080 |
| c(9) = [0 0 1 2 2 3 3 4] | 5040 |
| c(10) = [0 1 2 3 3 4 4 4] | 3360 |

According to some implementations, the sequence of relative symbol values in a codeword is unique to a given data word. The relative level sequence representing a recorded codeword is then unique for a given data word. Thus, the information to be stored can be encoded in the relative positions of cell levels, and the absolute level positions, e.g. electrical resistance values, can not be critical. Therefore, a substantially uniform shift in all levels, i.e. not changing the basic level order, caused by drift noise can not affect the detection of the read-back codeword. Thus, efficient coding and recording systems can be provided which can be resistant to drift effects in multi-level solid-state memories.

According to some implementations, the encoding scheme can be such that each of the possible input data words is encoded as a codeword with a unique sequence of symbol values relative to the lowest symbol value in the codeword. Examples are coding schemes based on permutation modulation variant 1 codes (see US 2011/0296274 A1). The codewords employed can comprise codewords of a set of one or more permutation modulation variant 1 codes. In particular embodiments, the standard codewords can include codewords of a single permutation modulation variant 1 code.

According to some implementations, each codeword can include a sequence of symbols whose values are symmetrically distributed about a predetermined reference sequence. Each possible input data word is then encoded as a codeword with a unique sequence of symbol values relative to the reference sequence, these relative values being symmetrically distributed about the reference sequence. Examples are coding schemes based on sign-change codes such as permutation modulation variant 2 codes. Here, each codeword can comprise a sequence of symbols whose values are symmetrically distributed about an all-zero reference sequence. Other examples can include finite reflection group coding schemes. Here, each codeword comprises a sequence of symbols whose values are symmetrically distributed about a reference sequence corresponding to a centre of gravity defined for the finite reflection group.

According to some implementations, the translation-stable codes include a union of permutation modulation codes. Thus, each code can be given by a set of initial vectors c(j). Then, the codewords are obtained by permuting the components of these initial vectors. When q cell levels are supported, the components of the initial vectors can take on q different values, e.g. $0, 1, 2, \ldots, q-1$. These q numbers are mapped one-to-one by the encoder or modulation encoder onto the q cell values that are supported by the solid-state memory.

The codewords of the first codeword type, i.e. the standard codewords, are derived from the initial vectors taking on values in the full range $0, 1, \ldots, q-1$. Furthermore, the excess codewords are derived from initial vectors taking on values in a limited range, e.g., in $0, 1, \ldots, q-2$. If there is only a single excess codeword [i i ... i], one chooses the level i to correspond to a resistance level, which can be written very easily and reliably, e.g., a value close to the set state. In the code examples 1 to 5 above, the excess codewords do not require writing the highest level. Clearly, one can impose other requirements on the excess codewords and these requirements depend on the cell characteristics. E.g., one can impose not to write the smallest level or any other specific level(s), which are difficult to write.

According to some implementations, the proposed encoding scheme is also effective against drift. The decoding can be based on the projection pr(.) of the read-back (received) word y onto the hyperplane H orthogonal to the all-one vector [1 1 ... 1] (see US 2011/0296274 A1). For a projection-based decoding scheme as in US 2011/0296274 A1, the relevant distance properties of the codewords are the distances after the projection pr(.) onto the hyperplane H.

The translation-stable code can include a number of initial vectors having N components, each of the N components having one of q symbol values for providing codewords of the first codeword type, in particular by permutation. Furthermore, the translation-stable code includes at least one further initial vector having N components, each of the N components having one of (q−d) symbol values for providing codewords of the second codeword type, in particular by permutation.

The state of the N cells can be determined in dependence on a write scheme for writing the encoded data word in the N cells. In particular, the write scheme is an adaptive iterative write scheme.

A method for writing a data word as an encoded data word in N cells of a solid state memory by a writing scheme having M iterations is suggested. Each of the N cells can be programmed in one of q levels. In a first step, the data word is encoded as a codeword of a first codeword type having q symbol values. In a second step, a first write signal is supplied to the N cells for writing the codeword of the first codeword type in the N cells. The second step is repeated, at most (M−1) times, until the codeword of the first codeword type is correctly written in the N cells.

If the codeword of the first codeword type has not been correctly written in the N cells, a third and a fourth step are performed. In other words, if the second step has been repeated (M−1) times, but the codeword of the first codeword type has still not been correctly written in the N cells, a third and a fourth step are performed.

In the third step, the data word is encoded as a codeword of a second codeword type having (q−d) symbol values, wherein $d \in [1, \ldots, q-1]$. In the fourth step, a second write signal is supplied to the N cells for writing the codeword of the second codeword type in the N cells.

Another method for decoding a codeword written in N cells of a solid state memory is provided. Each of the N cells can be programmed in one of q levels. The codeword is encoded by the method for above mentioned first aspect or of above mentioned third aspect. In a first step, a read back signal is received from the N cells by reading back the written codeword. In a second step, it is determined in dependence on the received read back signal if the written codeword is of the second codeword type. In a third step, side information is provided to an error correcting code in dependence on a determined written codeword of the second codeword type.

An encoder for encoding a data word for recording the encoded data word in N cells of a solid state memory is suggested. Each of the N cells can be programmed in one of q levels. The encoder is configured to encode the data word as a codeword of a first codeword type having q symbol values or as a codeword of a second codeword type having (q−d) symbol values, $d \in [1, \ldots, q-1]$, in dependence on a state of the N cells.

A decoder for decoding a codeword written in N cells of a solid state memory is suggested. Each of the N cells can be programmed in one of q levels. The decoder has a receiver and a processor. The receiver is configured to receive a read back signal from the N cells for reading back the written codeword. The processor is configured to determine if the written codeword is of the second codeword type in dependence on the received read back signal. Further, the processor is configured to provide side information to an error correcting code (ECC) in dependence on a determined written codeword of the second codeword type.

The provided side information can provide the possibility to design a more efficient ECC in terms of code rate and/or reliability. Recall that the encoding scheme according to embodiments of the invention encodes k input bits either in $2^k$ standard codewords or in a number Me of excess codewords. This can result in a number of benefits at the decoder side as described in the following: At read-back, the decoder or demodulator can detect that an excess codeword has been written and it can pass this side information to the ECC decoder. Depending on the total number Me of excess codewords, the information passed on to the ECC decoder, can be an erasure flag together with floor(log 2(Me)) bits of information about the written data. Thus, floor(log 2(Me)) of the k input bits can be recovered and the remaining input bits need to be obtained from the ECC.

Without a set of excess codewords, the modulation decoder can not be able to detect if there was a partially-defective cell that has been erroneously written and, thus, it can not pass such side information to the decoder of the overall ECC.

Further, the side information passed to the overall ECC decoder allows one to design more efficient codes and/or to use a given code in a more reliable fashion. In particular, in the simple case of one erasure flag and no additional recovered bits, the overall ECC can operate much more reliably than without error flags because these erasures can be counted as errors and error correction is more costly than erasure correction. If the modulation decoder passes more side information, e.g., when floor(log 2(Me)) is close to k, the overall ECC can be even more efficient.

The encoder can be any encoding means. Moreover, the decoder can be any decoding means.

The respective means, in particular the encoder and the decoder, can be implemented in hardware or in software. If the means are implemented in hardware, it can be embodied as a device, e.g. as a computer or as a processor or as a part of a system, e.g. a computer system. If the means are implemented in software it can be embodied as a computer program product, as a function, as a routine, as a program code or as an executable object.

Figure 1:
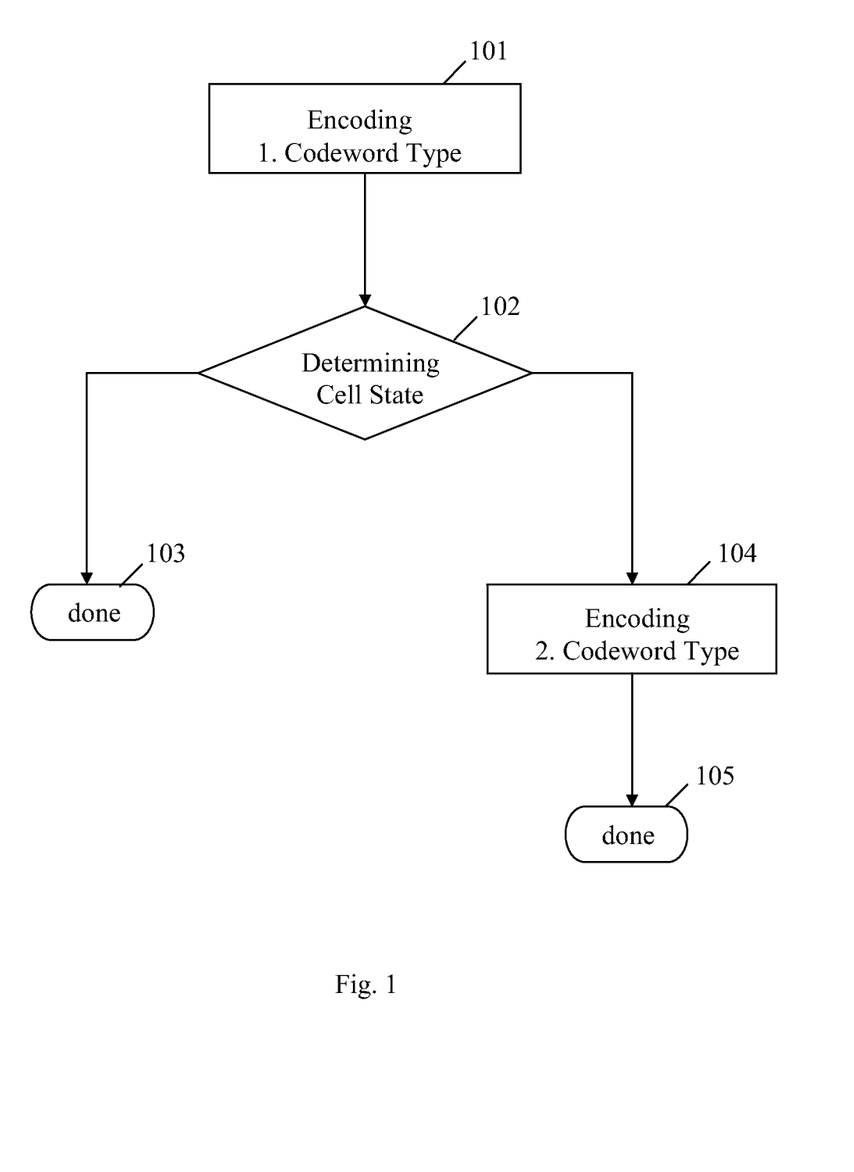
FIG. 1 shows an embodiment of a sequence of method steps for encoding a data word for writing the encoded data word in N cells of a solid state memory.

In FIG. 1, an embodiment of a sequence of method steps for encoding a data word for writing the encoded data word in N cells of a solid state memory is depicted. Each cell of the N cells can be programmed in one of q levels for storing data.

In step 101, the data word is encoded as a codeword of a first codeword type having q symbol values. Codewords of the first codeword type are so-called standard codewords, because their number q of symbol values is equal to the number q of levels of the cell.

In particular, the data word is encoded as the codeword of the first codeword type such that the codeword has N components. Each of the N components can be mapped to one of the N cells. Further, each of the N components has one of the q symbol values, where each of the q symbol values is mapped to one of the q levels of the mapped cell.

In step 102, a state of the N cells is determined. The state of the N cells can be determined in dependence on a write scheme for writing the encoded data word into the N cells. If the determined state of the N cells indicates that all N cells have been written correctly, the writing is complete (step 103). Otherwise, if the state of the cell indicates that not all N cells can be written correctly, the method proceeds with step 104.

In step 104, the data word is encoded as a codeword of a second codeword type. The codeword of the second codeword type has $(q-d)$ symbol values, wherein $d \in [1, \ldots, q-1]$. Particularly, the data word is encoded as the codeword of the second codeword type such that the codeword has N components, wherein each of the N components is mapped to one of the N cells and has one of the $(q-d)$ symbol values. Each of the $(q-d)$ symbol values is mapped to one of the $(q-d)$ levels of the mapped cell.

It can be noted that each codeword of the second codeword type has a Euclidean distance to each codeword of the first codeword type that is greater or equal to a minimum Euclidean distance between the codewords of the first codeword type. Further, it can be noted that a codeword of the second codeword type is not a codeword of the first codeword type.

Moreover, for encoding a data word as a codeword of the first codeword type or of the second codeword type, a translation-stable code can be used. The translation-stable code can include a number of initial vectors having N components, wherein each of the N components has one of q symbol values for providing codewords of the first codeword type. Furthermore, the translation-stable code can include at least one initial vector having N components, each of the N components having one of $(q-d)$ symbol values, where $0<d<q$, for providing codewords of the second codeword type. After step 104, the writing is complete (step 105). Steps 101-105 can be sequentially executed for a plurality of data words.

Figure 2:
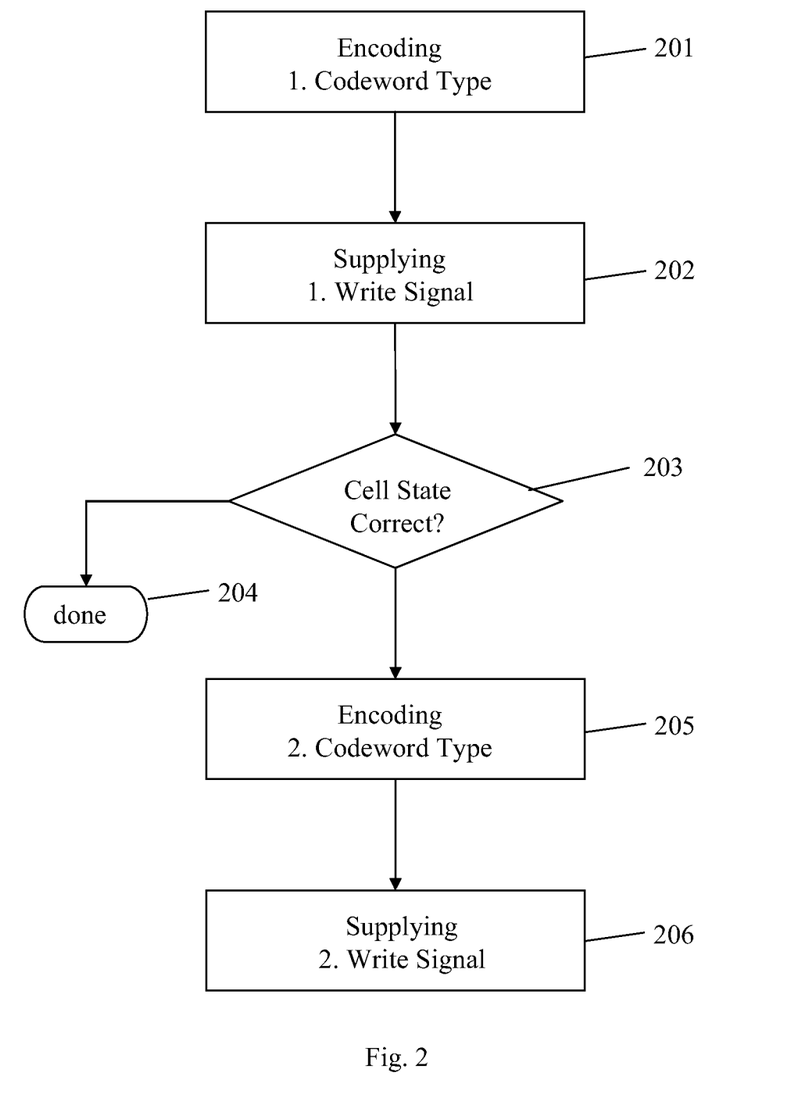
FIG. 2 shows an embodiment of a sequence of method steps for writing a data word as an encoded data word in N cells of a solid state memory.

FIG. 2 shows an embodiment of a sequence of method steps for writing a data word as an encoded data word in N cells of a solid state memory by a writing scheme having M iterations. Each of the N cells has q levels, which, for example, are resistance levels. In step 201, the data word is encoded as a codeword of a first codeword type having q symbol values.

In step 202, a first write signal is supplied to the N cells for writing the codeword of the first codeword type in the N cells. Step 202 is repeated until the codeword of the first codeword type is correctly written into the N cells. According to an embodiment, a cell is considered to be correctly written if the read-back signal lies within a predefined range around the written nominal level. It can be noted that step 202 is repeated at most $(M-1)$ times.

In step 203, it is checked if the codeword of the first codeword type is correctly written in the N cells after at most $(M-1)$ times. If the codeword of the first codeword type is correctly written in the N cells after $(M-1)$ times, the writing is complete (step 204). If the codeword of the first codeword type is not correctly written in the N cells after $(M-1)$ times, then the method proceeds with step 205. In step 205, the data word is encoded as a codeword of a second codeword type having $(q-d)$ symbol values, where $d \in [1, \ldots, q-1]$. In step 206, a second write signal is supplied to the N cells for writing the codeword of the second codeword type into the N cells.

Figure 3:
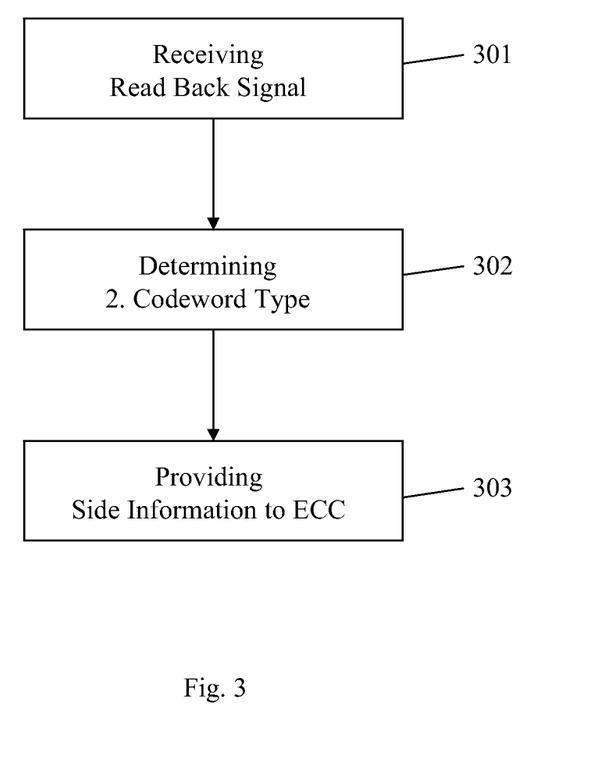
FIG. 3 shows an embodiment of a sequence of method steps for decoding a codeword written into N cells of a solid state memory.

In FIG. 3, an embodiment of a sequence of method steps for decoding a codeword written into N cells of a solid-state memory is illustrated. The codeword to be decoded was exemplarily encoded by the method for FIG. 1.

In step 301, a read-back signal is received from the N cells for reading back the written codeword. In step 302, it is determined if the written codeword is of the second codeword type. The determining is performed in dependence on the received read-back signal.

In step 303, side information is provided to an error correcting code (ECC) if the result of the determining step 302 is that the written codeword is of the second codeword type. Further, the side information is generated in dependence on the determined written codeword of the second codeword type. In particular, different written codewords of the second codeword type can result in different side information.

Figure 4:
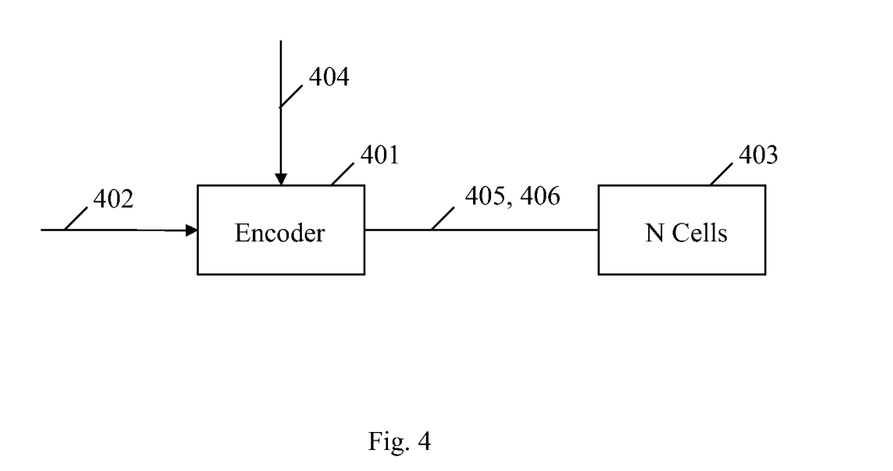
FIG. 4 shows a schematic block diagram of an embodiment of an encoder for encoding a data word for writing the encoded data word in N cells of a solid state memory.

FIG. 4 shows a schematic block diagram of an embodiment of an encoder 401 for encoding a data word 402 for writing the encoded data word in N cells 403 of a solid state memory. The N cells are schematically shown by one block 403. Each of the N cells 403 can be programmed in one of q levels for storing data.

The encoder 401 receives the data word 402 and a state 404 of the N cells. In particular, state 404 of the N cells 403 indicates that the N cells 403 include at least one partially-defective cell or no partially-defective cell.

If the N cells 403 include no partially-defective cell so that all N cells 403 can be written correctly, the encoder 401 encodes the received data word 402 as a codeword 405 of a first codeword type having q symbol values. Otherwise, if the N cells 403 include at least one partially-defective cell, the encoder 401 encodes the received data word 402 as a codeword 406 of the second codeword type. The encoder 401 provides the codeword 405 or the codeword 406 to the N cells 403.

Figure 5:
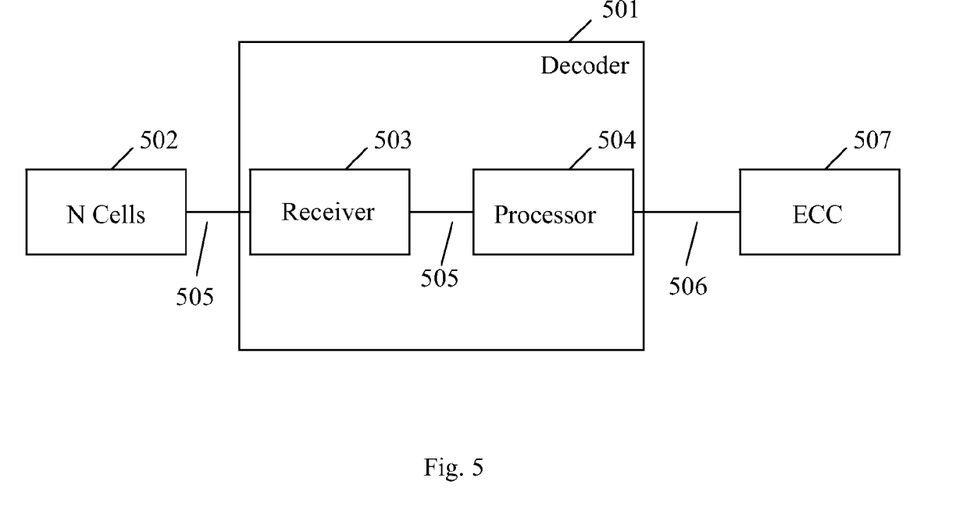
FIG. 5 shows a schematic block diagram of an embodiment of a decoder for decoding a codeword written into N cells of a solid state memory.

In FIG. 5, a schematic block diagram of an embodiment of a decoder 501 for decoding a codeword written into N cells 502 of a solid state memory is shown. The codeword to be decoded is encoded by the encoder 401 of FIG. 4 exemplarily.

The decoder 501 of FIG. 5 has a receiver 503 and a processor 504. The receiver 503 is configured to receive a read-back signal 505 from the N cells 502 for reading back the written codeword from the N cells 502. The processor 504 is configured to determine if the written codeword is of the second codeword type. For this determination, the processor 504 uses the read-back signal 505.

If it is determined that the written codeword is of the second codeword type, the processor 504 generates side information 506 and provides the generated side information 506 to an error correcting code (ECC) 507. The processor 504 generates the side information 506 in dependence on the read-back signal 505.

In the following, outer error correcting codes that can be used in connection with the present encoding and decoding scheme are described.

If the error rates of the present modulation codes are too high for reliable end-to-end data protection, an overall ECC scheme can be used to achieve the desired low error rates, e.g. in the $10^{-15}$ to $10^{-20}$ range. Suitable codes to reduce the error rates into these low ranges are Reed-Solomon (RS) codes over some finite Galois Field $GF(2^m)$.

As described above, the present encoding or modulation scheme provides additional side information about partially-defective cells. The benefit of this side information can not manifest itself directly at the demodulator output, but becomes apparent by the improved performance of the outer ECC. The outer ECC can be appropriately designed to leverage the side information and achieve improved performance.

If the code contains a single excess codeword, the side information can be given by an erasure flag at the demodulator output, which indicates if a modulation symbol, i.e., a codeword of the modulation code, was written onto a group of PCM cells, which contained a partially-defective cell. For each modulation symbol, the demodulator can either pass an erasure flag or the corresponding user data symbol to the ECC decoder. The ECC decoder can apply standard error-and-erasure decoding (as disclosed in R. E. Blahut, "Algebraic Codes for Data Transmission", Cambridge Univ. Press, 2003) and in this way use the soft-information, that is, the erasure flag provided by the demodulator.

In the case of multiple excess codewords, the side information generated at the decoder or demodulator, which is passed to the ECC decoder, can carry more information than one erasure bit. This multi-bit information can be efficiently used by a two-level coding scheme.

Figure 6:
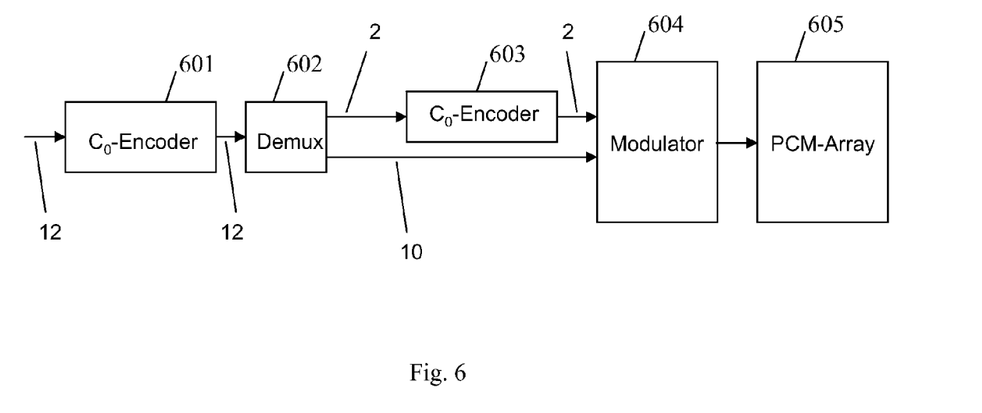
FIG. 6 shows a schematic block diagram of an embodiment of a two-level encoding scheme for the modulation code Cq5N7e10.

In this regard, FIG. 6 shows a schematic block diagram of an embodiment of a two-level encoding scheme for the modulation code Cq5N7e10, which operates on 12-bit symbols. The two-level encoding scheme of FIG. 6 has a $C_0$-Encoder 601, a demultiplexer (Demux) 602, a $C_1$-Encoder 603, a modulator 604 and a PCM array 605.

The two-level coding scheme consists of two codes, a large powerful outer code $C_0$ provided by the $C_0$-Encoder 601 and a smaller inner code $C_I$ provided by the $C_1$-Encoder 603. For example, the outer code $C_0$ is a Reed-Solomon (RS) code with an alphabet, which is matched to the symbol values at the modulator input, e.g., the RS-code alphabet is chosen to have the same size as the alphabet of the symbol values of the modulator. The inner code $C_I$ can be chosen to be a high-rate code, which can correct a few erasures. A good choice for the inner codes can be (extended) Hamming codes over $GF(2^s)$, which can correct up to two erasures.

The modulation code Cq5N7e10 contains $2^{12}$ standard codewords and $2^{10}$ excess codewords. The excess codewords can convey information for only 10 bits of the 12-bit data symbols. The inner code $C_I$ is designed to protect the missing 2 bits and, thus, it operates on 2-bit symbols, whereas the outer code operates on 12-bit symbols. Thus, the demultiplexer (Demux) 602 receives sequences of 12 bits from the $C_0$-Encoder 601 and outputs sequences of 2 bits to the $C_1$-Encoder 603 and sequences of 10 bits to the modulator 605 directly.

Figure 7:
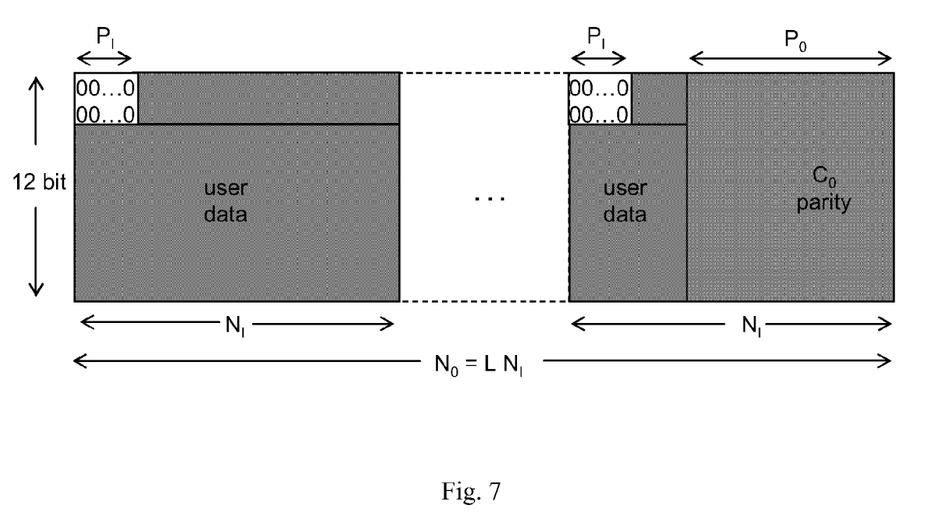
FIG. 7 shows a schematic diagram of a data format of a two-level error correcting code (ECC) for the modulation code Cq5N7e10.

The data format for the two-level coding scheme is adjusted to the alphabet sizes of the outer and inner codes $C_0$, $C_I$. FIG. 7 shows the data format at the bit level for an outer code over $GF(2^{12})$ of length $N_0$ with $P_0$ parity symbols and an inner code over $GF(2^2)$ of length $N_I$ with $P_I$ parity symbols. The columns correspond to codeword components of the outer code $C_0$. The region, which is filled with zeros, is adjusted to the 2-bit alphabet size and $P_I$ parity symbols of the inner code $C_I$. Given the inner code $C_I$, the outer code $C_0$ is designed to have a length $N_0$, which is a multiple of the length $N_I$ of the inner code, $N_0 = L N_I$.

The total number of user bits is $k = 12 (N_0 - P_0) - 2 L P_I$. For the modulation code Cq5N7e10, which uses n=7 cells per modulation symbol, the overall rate of this two-level coding scheme is $12 (N_0 - P_0) - 2 L P_I / (n N_0)$ bit/cell.

The two-level encoder operates in two steps. First, the $C_0$-Encoder 601 computes the $P_0$ parity symbols based on the user data and the L zero-regions of the inner code. In a second step, the $C_I$-Encoder 603 generates for each of the L inner codes $P_I$ parity symbols and overwrites the L zero-regions with the parity symbols.

The decoder of the two-level scheme operates in a two-stage decoding fashion: First, the inner decoder attempts to decode the erasures in each of the L $C_I$-codewords and it fills the zero-regions with zeros. If the inner decoder is successful, it passes the corrected user data (and the zero-region) to the outer decoder. Otherwise, it passes the uncorrected user data and the zero-region together with erasure flags to the outer decoder. In the second stage, the outer decoder applies error-and-erasure decoding.

For large data formats of about a page of user data (=4096 bytes), one can use long $[N_0, K_0, t_0]$-RS codes over $GF(2^{12})$ of length $N_0$, dimension $K_0$ and error correction capability $t_0$. By choosing the extended $[N_I = 86, K_I = 81, d_{min} = 4]$-Hamming code over $GF(2^2)$ as inner code, one can correct up to 2 erasures and maintain a 1-symbol safety margin. Thus, at best one can correct 2/86=2.33% erasures per symbol on average. Examples of code parameters are given in the following Table 9.

TABLE 9

| $N_I$ | $P_I$ | L | $N_O = L N_I$ | K | D | $K_O = K + D$ | $P_O$ | $t_O$ | $K/N_O$ | k [bit] | $RK/N_O$ |
|---|---|---|---|---|---|---|---|---|---|---|---|
| 86 | 5 | 33 | 2838 | 2731 | 28 | 2759 | 79 | 39 | 0.9623 | 32,778 | 1.65 bit/cell |
| 86 (64) | 5 | 32.744 | 2816 | 2731 | 28 | 2759 | 57 | 28 | 0.9698 | 32,778 | 1.66 bit/cell |

The parameter D specifies the difference between the dimension $K_O$ of the RS code and the number of useful user symbols K. It is given by D=floor$\{2 \times P_I \times L/12\}$, where floor$\{t\}$ denotes the largest integer not exceeding t. Moreover, user symbols and user bits are related by K=floor$\{k/12\}$. The parameters in the second row correspond to a two-level scheme, which uses 32 copies of the extended Hamming code and one shortened copy of length 64. Thus, the outer code has a code length $N_O$=32×86+64=2816. Furthermore, the last column indicates the overall rate of the two-level scheme for the modulation code Cq5N7e10 with rate R=12/7 bit/cell.

Figure 8:
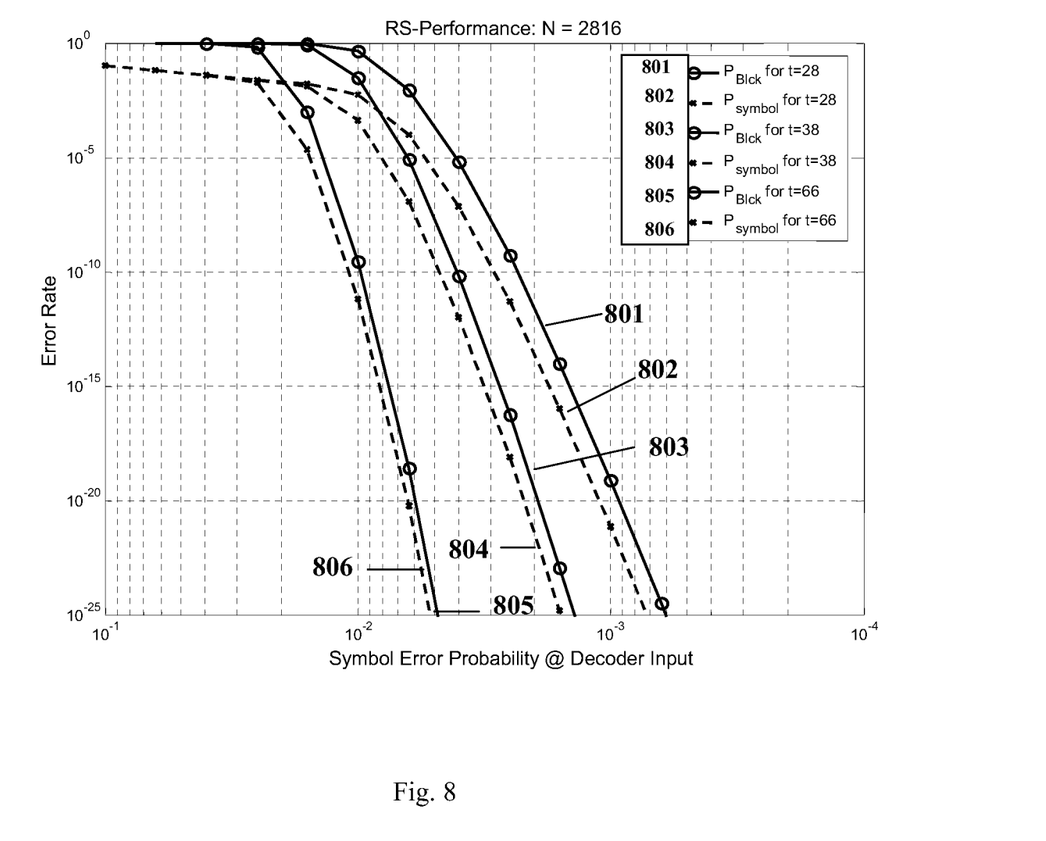
FIG. 8 shows a diagram illustrating block and symbol error rate performances of three length N=2816 RS Codes.

In FIG. 8, a diagram illustrating block and symbol error rate performances of three length N=2816 RS codes is depicted with error correction capabilities t=28, 38, and 66. The performance is analyzed for a channel with independent and identically distributed noise. The target Bit Error Rate (BER) is 1e-20 for the two examples [2816, 2628]-RS code and [2816, 2704]-RS code.

1. [2816, 2628]-RS code

Without erasure flagging, the code with minimum distance 189 can tolerate up to 2% erasure symbols per channel symbol, i.e., up to 56 erasures per block, and an additional channel symbol error rate up to 2e-3, as illustrated by the symbol error rate curve 804 with error correction capability t=38 at the target symbol error rate of 1e-20. With erasure flagging, the code can tolerate up to 2% erasure symbols per channel symbol, i.e., up to 56 erasures per block, and an additional channel symbol error rate up to 6e-3, as illustrated by the symbol error rate curve 806 with error correction capability t=66 at the target symbol error rate of 1e-20.

2. [2816, 2704]-RS code

Without erasure flagging, the code with minimum distance 113 can tolerate up to 2% erasure symbols per channel symbol, i.e., up to 56 erasures per block, but no additional channel errors. With erasure flagging, the code can tolerate up to 2% erasure symbols per channel symbol, i.e., up to 56 erasures per block, and an additional channel symbol error rate up to 1e-3, as illustrated by the symbol error rate curve 802 with error correction capability t=28 at the target symbol error rate of 1e-20. Further, it can be noted that similar performance results can be obtained for the other RS codes.

Figure 9:
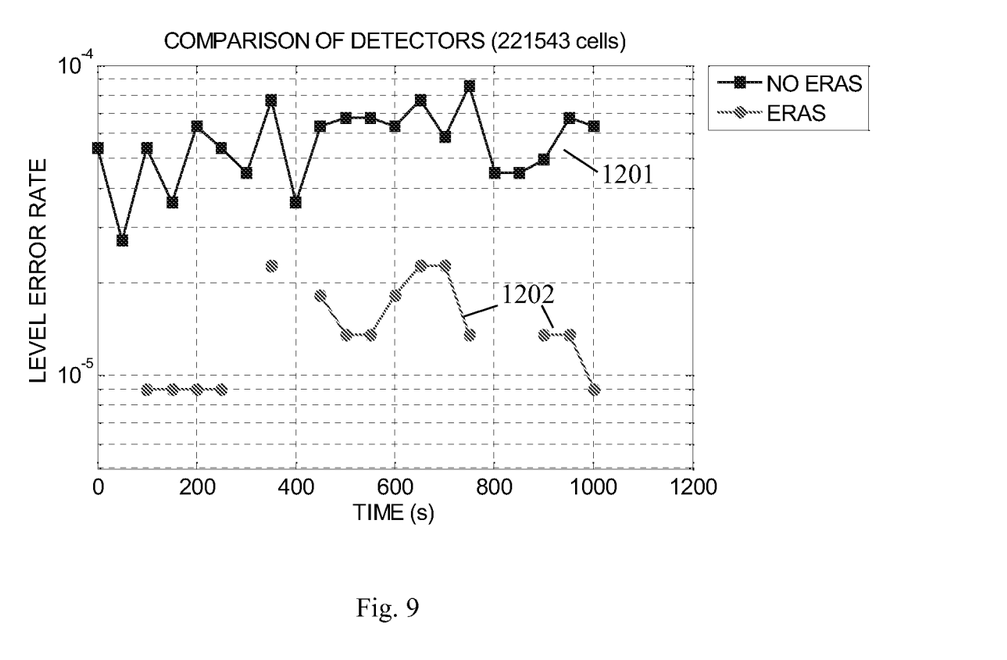
FIG. 9 shows a diagram illustrating potential improvements in level-error rate performance.

In FIG. 9, a diagram illustrating potential improvements in level-error rate performance is shown. The x-axis of FIG. 9 shows the time and the y-axis shows the level error rate. Further, curve 1201 shows erasures and curve 1202 shows no erasures. The probability of an occurrence of an erasure symbol is 0.0025.

The codewords can be flagged as erasures at the write-head level, i.e. immediately after writing. This is very effective as this information is freely available at writing. In the example from a PCM cell-array, just 0.25% of flagged codewords can give rise to a significant improvement in performance.

All above-mentioned embodiments of the device of the present invention can be embodied by respective steps to be a respective embodiment of the method for the present invention.

What has been described herein is merely illustrative of the application of the principles of the present invention. Other arrangements and systems can be implemented by those skilled in the art without departing from the scope and spirit of this invention.

The invention claimed is:

1. An encoder for encoding a data word for writing an encoded data word in N cells of a solid state memory, each of the N cells having q programmable levels, wherein the encoder is configured to encode the data word as a codeword of a first codeword type having q symbol values or as a codeword of a second codeword type having (q−d) symbol values, d$\in[1, \ldots, q-1]$, in dependence on a state of the N cells.

2. A decoder for decoding a codeword written in N cells of a solid state memory, each of the N cells having q programmable levels, said codeword being encoded by an encoder;

wherein said encoder is for encoding a data word for writing an encoded data word in N cells of the solid state memory, each of the N cells having q programmable levels; and wherein the encoder is configured to encode the data word as a codeword of a first codeword type having q symbol values or as a codeword of a second codeword type having (q−d) symbol values, d$\in[1, \ldots, q-1]$, in dependence on a state of the N cells, the decoder comprising;

a receiver which is configured to receive a read back signal from the N cells for reading back the written codeword; and a processor which is configured to determine if the written codeword is of the second codeword type in dependence on the received read back signal and which is configured to provide side information to an error correcting code in dependence on a determined written codeword of the second codeword type.

* * * * *